United States Patent [19]

Chau et al.

[11] Patent Number: 5,783,478
[45] Date of Patent: Jul. 21, 1998

[54] METHOD OF FRABRICATING A MOS TRANSISTOR HAVING A COMPOSITE GATE ELECTRODE

[75] Inventors: Robert S. Chau, Beaverton, Oreg.; David B. Fraser, Danville, Calif.; Kenneth C. Cadien, Portland, Oreg.; Gopal Raghavan, Mountain View, Calif.; Leopoldo D. Yau, Portland, Oreg.

[73] Assignee: Intel Corporation, Santa Clara, Calif.

[21] Appl. No.: 639,776

[22] Filed: Apr. 29, 1996

Related U.S. Application Data

[62] Division of Ser. No. 384,352, Feb. 2, 1995, Pat. No. 5,625,217, which is a continuation of Ser. No. 989,080, Dec. 11, 1992, abandoned.

[51] Int. Cl.[6] .................................................. H01L 21/3205
[52] U.S. Cl. ............................ 438/592; 438/303; 438/307
[58] Field of Search ...................... 437/41 RLD, 41 GS, 437/193, 200, 245, 246, 913; 438/592, 303, 307

[56] References Cited

U.S. PATENT DOCUMENTS

| | | | |
|---|---|---|---|
| 4,392,150 | 7/1983 | Courreges | 437/913 |
| 4,570,328 | 2/1986 | Price et al. | 148/DIG. 147 |
| 4,717,684 | 1/1988 | Katto et al. | 437/200 |
| 4,816,425 | 3/1989 | McPherson | 437/200 |
| 5,097,301 | 3/1992 | Sanchez | 257/408 |
| 5,110,408 | 5/1992 | Fujii et al. | 437/245 |
| 5,167,760 | 12/1992 | Mu et al. | 437/246 |
| 5,171,702 | 12/1992 | Prengle et al. | 437/28 |
| 5,189,504 | 2/1993 | Nakayama et al. | 257/422 |
| 5,236,549 | 8/1993 | Shirakawa et al. | 437/245 |

FOREIGN PATENT DOCUMENTS

| | | | |
|---|---|---|---|
| 6342173 | 2/1988 | Japan | 148/DIG. 105 |
| 8102222 | 8/1981 | WIPO | 437/265 |

*Primary Examiner*—Michael Trinh
*Attorney, Agent, or Firm*—Blakely, Sokoloff, Taylor & Zafman

[57] ABSTRACT

A novel, reliable, high performance MOS transistor with a composite gate electrode which is compatible with standard CMOS fabrication processes. The composite gate electrode comprises a polysilicon layer formed on a highly conductive layer. The composite gate electrode is formed on a gate insulating layer which is formed on a silicon substrate. A pair of source/drain regions are formed in the substrate and are self-aligned to the outside edges of the composite gate electrode.

10 Claims, 5 Drawing Sheets

METHOD OF FRABRICATING A MOS TRANSISTOR HAVING A COMPOSITE GATE ELECTRODE

This is a divisional of application Ser. No. 08/384,352, filed Feb. 2, 1995, U.S. Pat. No. 5,625,217, which is a continuation of application Ser. No. 07/989,080, filed Dec. 11, 1992, now ABANDONED.

BACKGROUND OF THE INVENTION

1. Field Of The Invention

The present invention relates to the field of semiconductor devices, and more specifically, to a MOSFET with a composite gate electrode which is compatible with standard CMOS processing.

2. Description Of Related Art

Transistors are well-known in the art. Transistors are the building blocks of all integrated circuits. Modern integrated circuits interconnect literally millions of transistors together to perform a wide variety of functions. The performance and reliability of a specific integrated circuit is directly related to the performance and reliability of the transistors of which it is comprised. Thus, in order to provide better performing integrated circuits in the future, one needs to improve the electrical characteristics of transistors.

FIG. 1 shows a cross-sectional view of a well-known lightly doped drain (LDD) metal oxide semiconductor (MOS) transistor 100. Transistor 100 has a standard polysilicon gate electrode 110. Transistor 100 has in the past been a very popular and widely used transistor because of its polysilicon gate electrode 110. An advantage of the polysilicon gate electrode is that it allows the transistor to be fabricated with well-known and extremely manufacturable standard CMOS processes. For example, the polysilicon gate allows a self-aligned LDD process to be utilized since the polysilicon gate can adequately mask the channel region of the transistor from LDD implants. A self-aligned process allows the LDD region of the transistor to always be perfectly aligned with the gate of the transistor regardless of mask alignment tolerances. Another advantage of polysilicon gate 100 is that a self-aligned silicide process can be used to form silicide 112 on the source, drain, and gate of the transistor. Transistor 100 is compatible with the self-aligned silicide process because polysilicon gate 110 is not vulnerable to the etch used to remove unreacted metal, which is required in the metallic silicide process.

Unfortunately, however, the performance of the standard polysilicon gate transistor 100 is poor due to polysilicon depletion effects. Polysilicon depletion effects reduce the amount of gate voltage applied across the gate oxide. This in turn reduces the drive current of the transistor. Since speed is directly proportional to the drive current, the speed performance of the standard polysilicon gate transistor is poor. The speed performance of the standard polysilicon gate transistor 100 is poor due to polysilicon depletion effects.

FIG. 2 is a cross-sectional view of another well-known transistor 200. Transistor 200 has a metal gate electrode 210. Metal gate electrodes are beneficial because their electrical characteristics are superior to doped polysilicon gate electrodes. Unfortunately, however, such metal gates are incompatible with modern CMOS processing techniques. For example, a self-aligned source/drain implant can not be used in metal gate devices because metal gates can not adequately mask the channel region from impurity doping during the implant. Additionally, metal gate electrodes are incompatible with self-aligned silicide processes because they can be damaged by the etch, which is required to remove the unreacted metal, in the silicide process.

Thus, what is desired is a high performance semiconductor transistor which does not exhibit polysilicon depletion effects and which is compatible with a standard CMOS fabrication process.

SUMMARY OF THE INVENTION

A novel, high performance, highly reliable LDD MOSFET transistor having a composite gate electrode which does not suffer from polysilicon depletion effects and which is compatible with standard CMOS processing is described. The LDD MOSFET has a composite gate comprising a polysilicon layer formed on a conductive layer. The conductive layer may be formed from TiN, W, Mo, polycrystalline carbon or any metallic silicide with the appropriate work function. The polysilicon layer and the conductive layer of the composite gate electrode have exactly the same length and width. The composite gate is formed on a substrate of a first conductivity type with a gate insulating layer formed between them. A pair of lightly doped drain regions of a first concentration of a second conductivity type are formed in the substrate and in alignment with laterally opposite sidewalls of the composite gate electrode. A pair of silicon nitride or oxide spacers are formed adjacent to laterally opposite sides of the composite gate. The spacers and the polysilicon layer completely encapsulate the conductive layer of the composite gate electrode. A pair of source/drain regions of a second concentration of the second conductivity type are formed in the substrate in alignment with the outside edges of the silicon nitride spacers. Silicide is formed on the source/drain region and on the polysilicon layer of the composite gate.

A goal of the present invention is to provide a high performance, reliable MOS transistor which can be manufactured with a standard CMOS process.

Another goal of the present invention is to provide a MOS transistor which does not exhibit polysilicon depletion effects.

Yet another goal of the present invention is to provide a high performance transistor which is compatible with a standard self-aligned source/drain implant and a standard self-aligned silicide process.

Still yet another goal of the present invention is to provide an MOS transistor which is extremely stable under high temperature and bias stress conditions.

BRIEF DESCRIPTION OF THE DRAWINGS

FIG. 4b is a cross-sectional illustration of the formation of a composite gate electrode on the substrate of FIG. 4a.

DETAILED DESCRIPTION OF THE PRESENT INVENTION

The present invention discloses a novel, high performance, highly reliable metal oxide semiconductor (MOS) transistor with a composite gate electrode which is compatible with standard CMOS processing. In the following description numerous specific details such as doping doses, doping types, manufacturing methods etc. are set forth in order to provide a thorough understanding of the present invention. It will be obvious, however, to one skilled in the art that the present invention may be practiced without these specific details. In other instances well-known metal oxide semiconductor transistor concepts and fabrication techniques have not been set forth in detail in order to not unnecessarily obscure the present invention.

Figure 1:
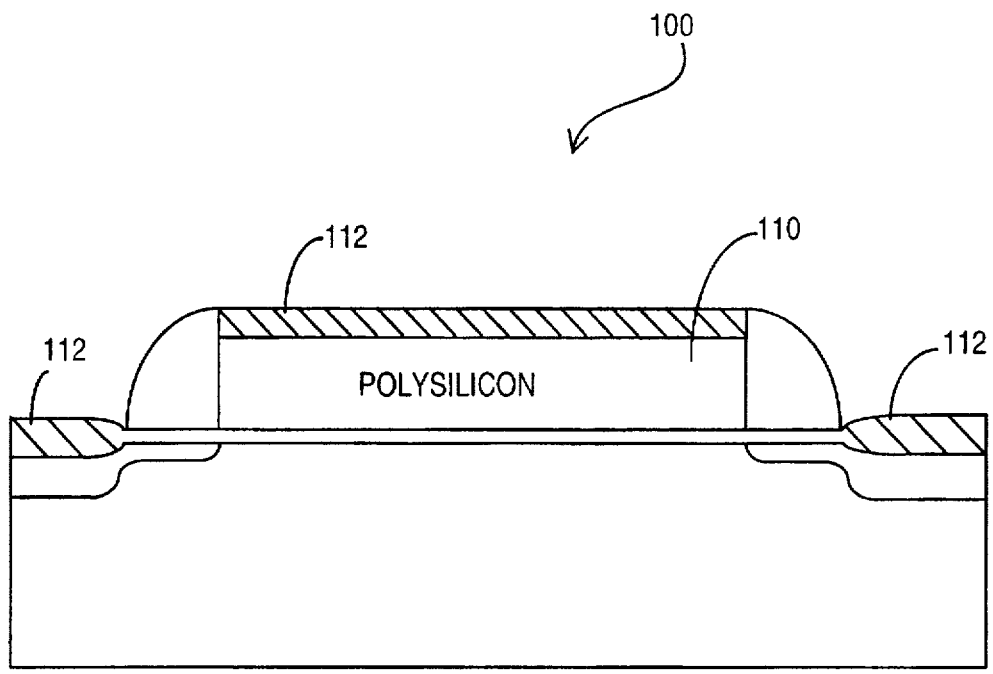
FIG. 1 is a cross-sectional illustration of a conventional LDD MOS transistor with a standard polysilicon gate electrode.
Figure 2:
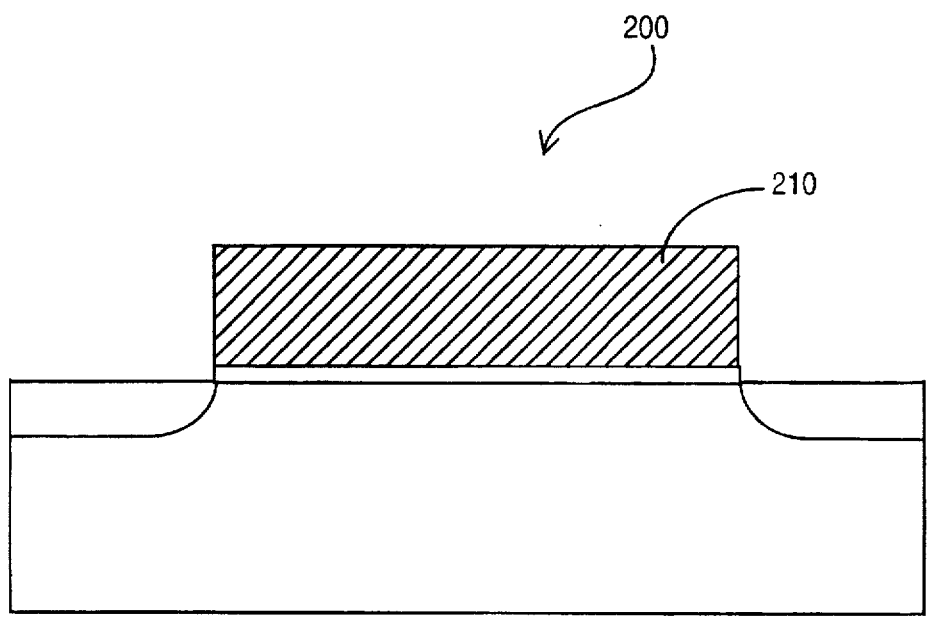
FIG. 2 is a cross-sectional illustration of a conventional MOS transistor with a metal gate electrode.
Figure 3:
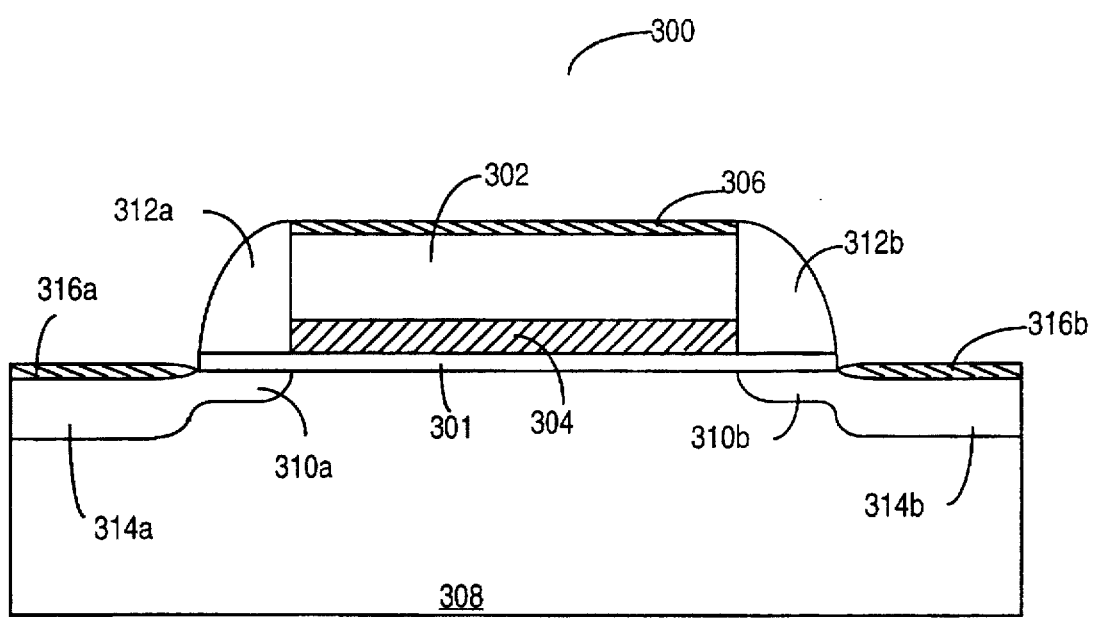
FIG. 3 is a cross-sectional illustration of an LDD MOSFET with a composite gate electrode.

The preferred embodiment of the novel MOS transistor with a composite gate electrode of the present invention is shown FIG. 3. The composite gate electrode is used to form a high performance, lightly doped drain (LDD) metal oxide semiconductor (MOS) transistor 300. The novel composite gate electrode significantly improves the LDD MOS transistor's electrical performance and reliability. Additionally, the method of forming the novel gate electrode is completely compatible with present well-known CMOS processing technologies.

The composite gate electrode comprises a polysilicon layer 302 formed on a thin, highly conductive layer 304. Silicide 306 can also be formed on the top surface of polysilicon layer 302 in order to reduce the gate contact resistance of transistor 300. In one embodiment an n-channel transistor 300 is formed in a P doped silicon substrate 308. An oxide layer 301 provides the gate insulator for transistor 300. Lightly doped drain (LDD) regions 310a and 310b of N- conductivity are formed in alignment with the outside edges of the composite gate electrode. Spacers 312a and 312b are formed adjacent to the outside edges of the composite gate electrode. Source/drain regions 314a and 314b are formed in alignment with the outside edges of spacers 312a and 312b. Silicide 316a and 316b can be formed on source/drain regions 314a and 314b.

The thin conductive layer 304 significantly improves the electrical characteristics of transistor 300 over transistors having a standard polysilicon gate. Conductive layer 304 completely eliminates the polysilicon depletion effects associated with standard polysilicon gate devices. By eliminating the poly-depletion effects, the drive capability of transistor 300 is increased by 10%–20% over standard polysilicon gate devices. Since drive capability is directly proportional to device speed, the speed performance of transistor 300 is improved over standard polysilicon gate devices.

Additionally, transistor 300 exhibits other performance improvements over the standard polysilicon gate transistors due to its composite gate. The gate oxide tunneling current of transistor 300 is at least one order of magnitude lower than standard polysilicon gate devices for the same electric field. The gate oxide break-down field of transistor 300 is also about 10% higher than that of standard polysilicon gate devices. Transistor 300 also exhibits minimal charge trapping after bias/temperature stress. Additionally, it is to be noted that there is very little interaction between the gate oxide 301 and the conductive layer 304. These characteristics makes transistor 300 a very stable, reliable and excellent performing transistor.

Figure 4A:
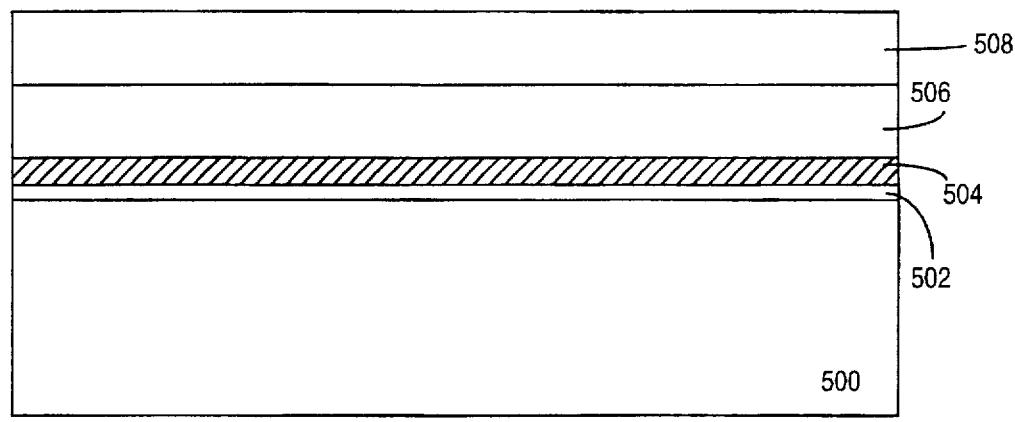
FIG. 4a is a cross-sectional illustration of a silicon substrate having an oxide layer, a conductive layer, a polysilicon layer, and a photoresist layer formed thereon.

In fabrication of the invented MOS semiconductor transistor with the presently preferred process, a p-type silicon substrate 500 shown in FIG. 4a is used. The p-type substrate 500 is doped with an approximately $10^{13}$ cm$^{-2}$ dose of Boron atoms. Next, a 20–200 Å oxide layer 502 is grown on substrate 500. The oxide layer 502 will provide the gate insulator for the transistor. Oxide layer 502 can be grown in a diffusion furnace at approximately 920° C. at atmosphere in 91% $O_2$ and 9% TCA.

Next, a 20–2000 Å conductive layer 504 is formed over the oxide layer 502. A variety of different materials can be used for conductive layer 504. The material chosen must be able to withstand high temperature (i.e., greater than 850° C.) processing. It must be highly conductive (i.e., have a higher conductivity than n+ polysilicon). It is preferred to have a work function close to the mid-gap of silicon, and ideally at the mid-gap of silicon for CMOS applications. Finally, it should be able to be formed uniformly across a wafer and consistently from wafer to wafer. The following materials have been found to meet the necessary physical and electrical requirements of conductive layer 504: Titanium- Nitride (TiN), Tungsten (W), polycrystalline carbon (C), and just about any metallic silicide with the appropriate work function. The preferred embodiment of the present invention utilizes an approximately 500 Å titanium nitride conductive layer 504. If the present invention is used to optimize only NMOS or PMOS transistors performance, the mid-gap work function may not be required, and many metals which can resist high temperatures will work.

If titanium nitride is used it is formed with a reactive sputter process. Titanium nitride is formed by sputtering titanium from a titanium target in a nitrogen and argon ambient. The percentage of $N_2$ can be from 100%–30% with the remainder argon. The presently preferred embodiment forms a nitrogen rich titanium nitride layer by using a 70% $N_2$–30% Argon ambient. The titanium nitride is sputtered in a DC magnetron deposition chamber at a pressure of approximately four mtorr and a power of approximately three kilowatts. If tungsten is used it can be sputtered from a tungsten target at room temperature in an Argon ambient with a power of approximately 1.5–2 kilowatts and a pressure of approximately 30–50 mtorr. If polycrystalline carbon is utilized, it can be formed by CVD deposition in a downstream RF plasma reactor with 5% $CH_4$ and <0.1% $BCL_3$ by volume, with the remainder argon. Polycrystalline carbon is formed at a temperature of approximately 750° C. and at a pressure of approximately 1.5 torr.

After formation of the conductive layer 504, a polycrystalline silicon (polysilicon) layer 506 is formed. The polysilicon layer 506 is formed by LPCVD in $SiH_4$ at a pressure of 130–190 mtorr and at a temperature of approximately 620° C. In the preferred embodiment of the present invention the polysilicon layer 506 is formed to a thickness of approximately 3500 Å. A photoresist layer 508 is then formed over the polysilicon layer 506.

Figure 4B:
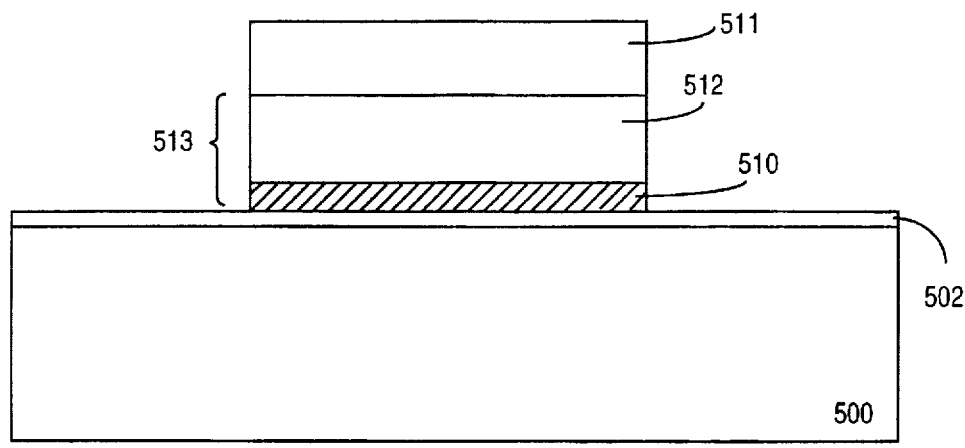

Next, as shown in FIG. 4b, a gate electrode 513 is formed from the polysilicon layer 506 and the conductive layer 504. First the photoresist layer 508 is masked, exposed, and developed with well known techniques to define the location 511 where the gate electrode 513 is to be formed. Next, the polysilicon layer is anisotropically etched in a reactive ion etcher with a HBr, Cl$_2$, He chemistry to form the top portion 512 of the composite gate electrode 513. If titanium nitride is used as conductive layer 504, it is etched in-situ with the polysilicon layer and with the same chemistry as a polysilicon layer to form the lower gate electrode 510. Titanium nitride and most metallic suicides are preferred as conductive layer 504 because a single etch step can be utilized to form the composite gate electrode 513. The gate electrode is etched in-situ until the oxide layer 502 is reached. (It is to be appreciated that some of the exposed oxide layer 502 will be etched away.) The completion of the gate electrode etch can be endpoint detected by analyzing the residual gas exhausted during the etch.

If tungsten is utilized as the conductive layer 504 it is plasma etched (after the polysilicon etch) in a two step process. First it is etched in NF3 and argon and then followed by a second plasma etch in SF$_6$/Cl$_2$/He. If polycrystalline carbon is utilized, it is also plasma etched (after the polysilicon etch). It is to be appreciated that after the composite gate electrode patterning, conductive layer 510 and polysilicon layer 512 have exactly the same length and width. After the composite gate electrode has been fully defined, photoresist 511 is removed with well-known techniques.

Figure 4C:
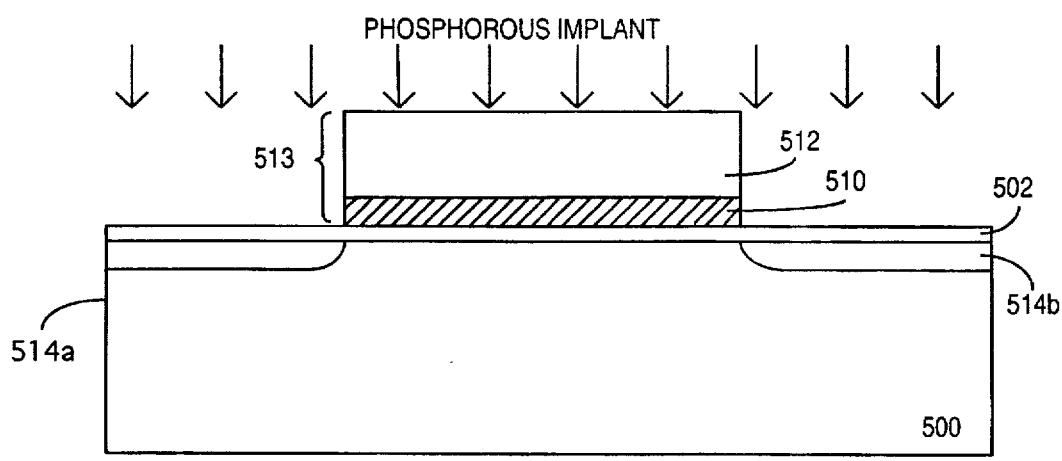
FIG. 4c is a cross-sectional illustration of the formation of a pair of LDD regions in the substrate of FIG. 4b.

As shown in FIG. 4c, after the formation of the composite gate electrode 513 a pair a n- lightly doped drain (LDD) regions 514a and 514b are formed. The LDD regions 514a and 514b are formed with a standard CMOS self-aligned process. The lightly doped drain regions 514a and 514b are formed by implanting phosphorus atoms at a dose of approximately $1\times10^{14}$ cm$^{-2}$ at an energy of approximately 40 KEV. The exposed oxide layer 502 prevents the surface of substrate 500 from being damaged by the implant. The lightly doped drain regions 514a and 514b are formed in alignment with opposite sidewalls running along the width of the gate electrode 513. The polysilicon layer 512 acts as a mask for the LDD implant. In this way the LDD regions 514a and 514b are self aligned to the gate electrode 513 regardless of mask alignment tolerances. It is to be appreciated that such a self-aligned process is not possible with fully metal gates because they cannot sufficiently mask the channel region from the implant. It is also to be appreciated that at this time the polysilicon layer 512 becomes doped with phosphorous atoms.

Figure 4D:
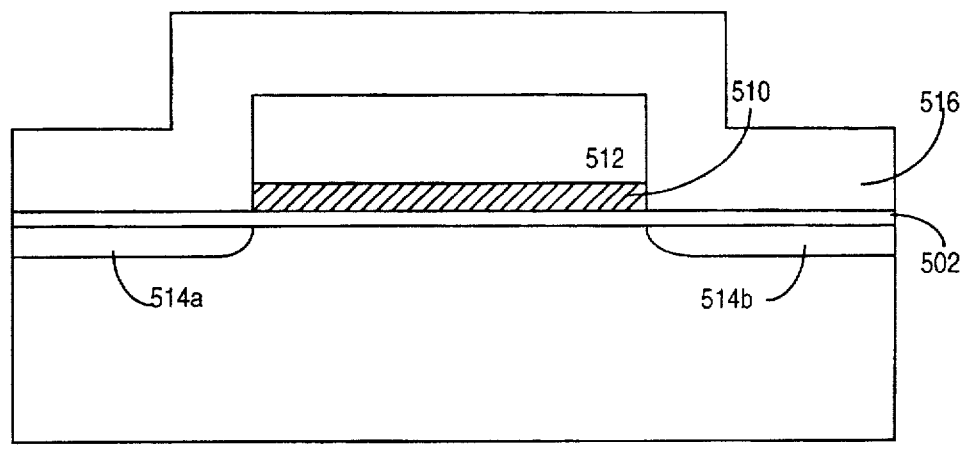
FIG. 4d is a cross-sectional illustration of the formation of a conformal silicon nitride or oxide layer over the substrate of FIG. 4c.

Next, as shown in FIG. 4d, an approximately 2500 Å very conformal layer of silicon nitride 516 is deposited over the entire substrate. The silicon nitride layer 516 is formed by LPCVD with SIH$_2$ Cl$_2$ and NH$_3$ at approximately 800°0 C. in a hot wall reaction chamber. Such a process forms a very conformal silicon nitride layer. A very thin (approximately 200 Å) oxide layer may be grown before the silicon nitride layer to provide the silicon nitride layer 516 with a good starting surface. Although a silicon nitride layer is preferred, it is to be appreciated that a CVD oxide layer can be utilized in place of the silicon nitride layer 516.

Figure 4E:
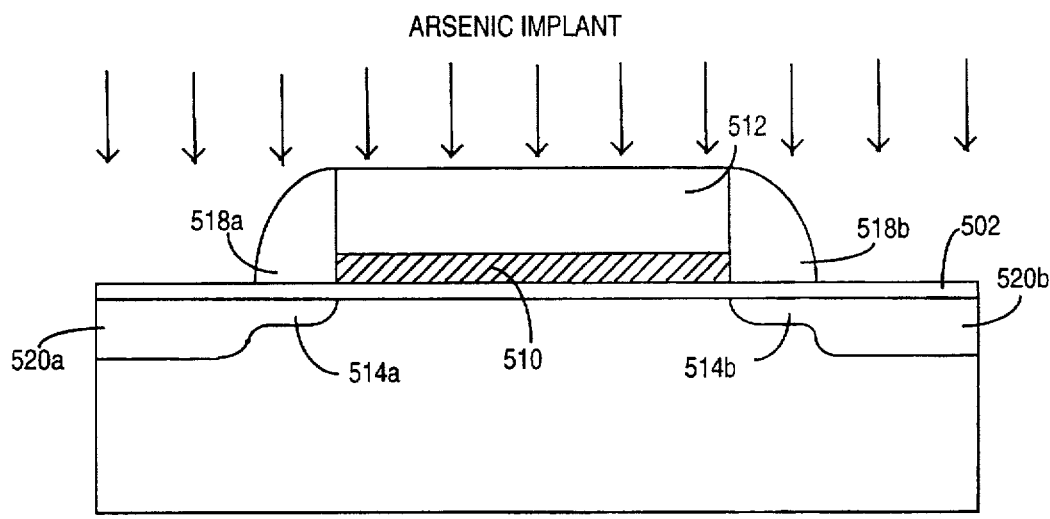
FIG. 4e is a cross-sectional illustration of the formation of a pair of spacers and the formation of a pair of source/drain regions in the substrate of FIG. 4d.

Next, as shown in FIG. 4e, the silicon nitride layer 516 is anisotropically etched to form sidewall spacers 518a and 518b on each side of gate electrode 513. A conformal layer 516 is required in order to form spacers which have a uniform and precisely controlled thickness across a wafer. The silicon nitride layer is anisotropically etched by plasma ion etching with CF$_3$/O$_2$. It is to be noted that now conductive layer 510 is completely protected and encapsulated by spacers 518a and 518b and polysilicon layer 512. This is extremely important because later process steps, such as in the planarization of interlevel dielectrics, utilize steam processes which can seriously corrode exposed metal layers.

After formation of spacers 518a and 518b, N+ source/drain regions 520a and 520b are formed. The N+ source/drain regions are formed by ion implanting arsenic atoms at a dose of approximately $6\times10^{15}$ cm$^{-2}$ at an energy of approximately 100 kev. The spacers 518a and 518b and the polysilicon layer 512 prevent the channel region from becoming N+ doped. The source/drain regions 520a and 520b are formed in alignment with the outside edges of sidewall spacers 518a and 518b. The polysilicon layer 512 becomes N+ doped with arsenic atoms. Again, oxide layer 502 protects the surface of the silicon substrate 500 from becoming damaged during the arsenic implant.

Next, the substrate 500 is annealed in an N$_2$ ambient at 900°0 C. for approximately 10 minutes in a standard furnace. The anneal activates the phosphorus and arsenic atoms from the LDD and source/drain implants. It is because of this high temperature anneal that the conductive layer 510 must be able to withstand high temperature processing. After the anneal, the exposed oxide 502 over the source/drain regions is removed by an HF dip.

Figure 4F:
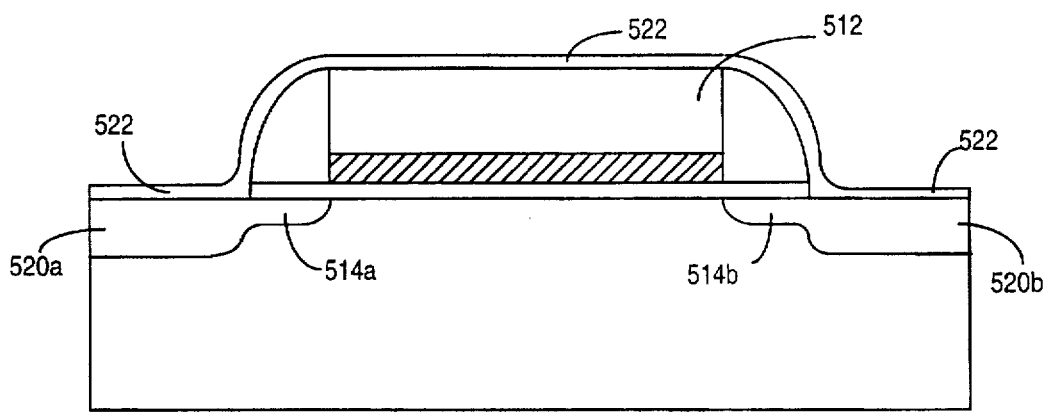
FIG. 4f is a cross-sectional illustration of the formation of a metal layer over the substrate of FIG. 4e.
Figure 4G:
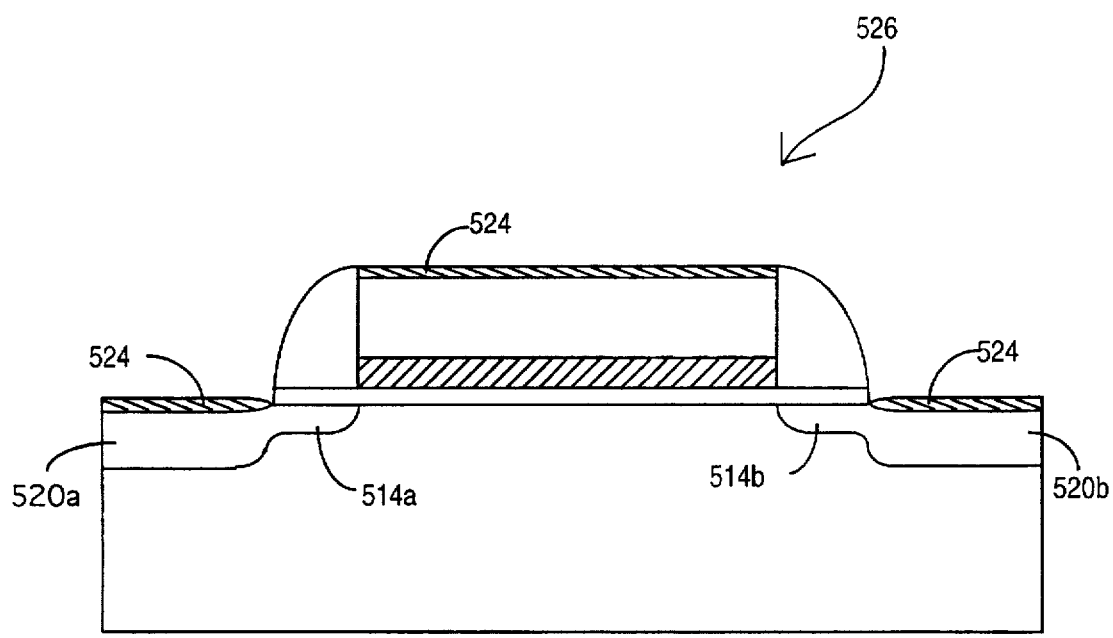
FIG. 4g is a cross-sectional illustration of the formation of silicide regions on the source/drain regions and on the polysilicon layer on the substrate of FIG. 4f.

Silicide can now be formed on the polysilicon layer 512 and on the N+ source/drain regions 520a and 520b. Silicide can dramatically improve the performance of the fabricated transistor. Silicide is formed in the present invention with a well-known self-aligned processes. First, as shown in FIG. 4f, a thin metal layer 522 such as titanium or tungsten is formed over the entire device structure. Next, the metal layer 522 is heated or annealed which causes a silicide reaction to occur wherever the metal is in contact with reactive silicon (i.e., on the source/drain regions 520a and 520b and on the polysilicon layer 512), everywhere else (i.e., over the spacers and field oxides) the metal remains unreacted. Next, the unreacted metal is selectively removed with the use of an etchant which does not attack the silicide. As such, as shown in FIG. 4g, suicide 524 is formed on the gate, source, and drain of the fabricated transistor. During the silicide formation, the conductive layer 510 is well sealed by spacers 518a and 518b and the polysilicon layer 512.

It is to be appreciated that the LDD MOSFET with a composite gate electrode of the present invention is now complete. At this time other wellknown process steps are used to complete the fabrication of the MOSFET. An interlayer dielectric is deposited to separate the gate from the metal layer to follow. This process generally employs a steam flow process for planarization which can damage conductive layer 510 if it is not fully protected. Metal contacts are fabricated next to electrically couple the device to other elements in the circuit. A protective glass or passivation is formed over the device to protect the device from contamination or electrical short.

It is to be appreciated that although the present invention has been described with respect to an LDD MOSFET, aspects of the present invention are equally applicable to standard transistors without LDD regions. It is also to be appreciated that although n-channel transistors have been described in detail herein, the present invention may also be practiced as a p channel transistor. In fabricating a p-channel device, the doping conductivities of the p channel device are simply opposite to those of the n channel device. The device is formed in an n-type substrate or well with p- LDD regions and p+ source/drain regions formed respectively therein. The gate electrode would still be a composite gate comprising a polysilicon layer formed on a conductive layer in order to eliminate polysilicon depletion effects. Spacers would also be utilized for source/drain alignment and silicide processes. It is also to be appreciated that the composite gate electrode is useful in both long channel and submicron channel transistors.

Thus, a novel LDD MOS transistor with a composite gate electrode and a standard CMOS compatible fabrication process has been described.

We claim:

1. A method of fabricating a lightly doped drain metal oxide semiconductor transistor, comprising the steps of:

forming a gate insulating layer on a substrate of a first conductivity type;

forming a composite gate electrode having laterally opposite sidewalls, comprising the steps of:

forming a conductive layer on said gate insulating layer;

forming a polysilicon layer on said conductive layer, said conductive layer selected from the group consisting of TiN, W, polycrystalline carbon, and metallic silicides;

forming a photoresist mask on said polysilicon layer;

dry etching said polysilicon layer; and dry etching said conductive layer, wherein said polysilicon layer has approximately the same length and width as said conductive layer;

forming a pair of lightly doped drain regions of a first concentration of a second conductivity type in said substrate in alignment with said laterally opposite sidewalls of said composite gate electrode;

forming a pair of spacers adjacent to said laterally opposite sidewalls of said composite gate electrode, wherein said spacers laterally enclose said conductive layer;

forming a pair of source/drain regions of a second concentration of said second conductivity type by ion implantation in alignment with the outside edges of said spacer; and reacting a refractory metal with said polysilicon layer and said substrate to form a silicide layer on said polysilicon layer and on said pair of source/drain regions.

2. The method of claim 11, wherein said pair of lightly doped drain regions are formed by an ion implantation process.

3. The method of claim 1, wherein said step of etching said polysilicon layer is performed by a dry anisotropic etch process using a first etchant, and wherein said step of etching said conductive layer is performed using said first etchant.

4. The method of claim 1, wherein said step of etching said polysilicon layer is performed using a dry anisotropic etch process in a reactive ion etcher, and wherein said step of etching said conductive layer comprises the steps of:

plasma-etching said conductive layer in a first plasma comprising $NF_3$; and plasma-etching said conductive layer in a second plasma comprising $SF_6$ and $Cl_2$.

5. The method of claim 1, wherein said spacers are silicon nitride.

6. The method of claim 5, wherein said conductive layer has a thickness of approximately 500 Å and said polysilicon layer has a thickness of approximately 3500 Å.

7. The method of claim 5, wherein said first conductivity type is p type conductivity, and said second conductivity type is n type conductivity.

8. A method of fabricating a lightly doped drain metal oxide semiconductor transistor, comprising the steps of:

forming a gate insulating layer on a substrate of a first conductivity type;

forming a composite gate electrode having laterally opposite sidewalls, further comprising the steps of:

forming a conductive layer on said gate insulating layer said conductive layer selected from the group consisting of TiN, W, polycrystalline carbon, and metallic silicides;

forming a polysilicon layer on said conductive layer;

forming a photoresist mask over said polysilicon layer;

etching said polysilicon layer; and etching said conductive layer, wherein said polysilicon layer has approximately the same length and width as said conductive layer; forming a lightly doped drain region of a first concentration of a second conductivity type in said substrate in alignment with one of said laterally opposite sidewalls of said composite gate electrode;

forming a spacer adjacent to said one of said laterally opposite sidewalls of said composite gate electrode;

forming a pair of source/drain regions of a second concentration of said second conductivity type in said substrate of said first conductivity type, wherein said second concentration of said second conductivity type is greater than said first concentration of said second conductivity type; and forming silicide on said polysilicon layer and on said pair of source/drain regions utilizing a self-aligned process.

9. The method of claim 8, wherein said lightly doped drain region is formed by an ion implantation process.

10. The method of claim 8, wherein said spacer is silicon nitride.

* * * * *

UNITED STATES PATENT AND TRADEMARK OFFICE
CERTIFICATE OF CORRECTION

PATENT NO.    : 5,783,478
DATED         : July 21, 1998
INVENTOR(S)   : Chau et al.

It is certified that error appears in the above-identified patent and that said Letters Patent is hereby corrected as shown below:

Title page, item [54] and col. 1, line 1,   delete "FRABICATING" and insert--FABRICATING In column 5 at line 8 delete "suicides" and insert --silicides--

Signed and Sealed this

First Day of December, 1998

Attest:

Attesting Officer

BRUCE LEHMAN
Commissioner of Patents and Trademarks

UNITED STATES PATENT AND TRADEMARK OFFICE
CERTIFICATE OF CORRECTION

PATENT NO. : 5,783,478
DATED : July 21, 1998
INVENTOR(S) : Chau et al.

It is certified that error appears in the above-identified patent and that said Letters Patent is hereby corrected as shown below:

In column 7 at line 20 delete "suicides" and insert --silicides--

Signed and Sealed this

Thirtieth Day of November, 1999

Q. TODD DICKINSON

*Attest:*

*Attesting Officer*       *Acting Commissioner of Patents and Trademarks*